United States Patent [19]

Bogardus et al.

[11] Patent Number: 4,701,696
[45] Date of Patent: Oct. 20, 1987

[54] RETARGETABLE BUFFER PROBE

[75] Inventors: David W. Bogardus, Beaverton; Robin L. Teitzel; David D. Chapman, both of Portland, all of Oreg.

[73] Assignee: Tektronix, Inc., Beaverton, Oreg.

[21] Appl. No.: 801,450

[22] Filed: Nov. 25, 1985

[51] Int. Cl.⁴ .................. G01R 31/28; G01R 31/02
[52] U.S. Cl. ............................ 324/73 R; 324/158 F
[58] Field of Search ............. 324/158 F, 73 PC, 73 R

[56] References Cited

U.S. PATENT DOCUMENTS 3,808,532  4/1974  Yuska ............................. 324/158 F

FOREIGN PATENT DOCUMENTS 2260257  8/1975  France ............................ 324/73 PC

OTHER PUBLICATIONS

Dougherty, R. A.; "DIP Switch Isolates Faults in System"; Electronics; May 15, 1975; p. 112.

Primary Examiner—Ernest F. Karlsen
Attorney, Agent, or Firm—Francis I. Gray; John Dellett

[57] ABSTRACT

A probe for a logic analyzer includes a replacement plug assembly comprising those portions of probe equipment which must be specifically adapted to accommodate a selected microprocessor, and a buffer probe assembly comprising those portions of probe equipment which are adapted for use with a wide variety of microprocessors. The replacement plug assembly and the buffer probe assembly are mechanically joined and electrically coupled by a square pin connector so that the replacement plug assembly may be removed from the probe and replaced with a differently configured replacement plug assembly when a different microprocessor is to be probed. Thus only a portion of the probe is changed to retarget the probe for different microprocessors. Each replacement plug assembly cross-connects data, address, and control lines of the associated microprocessor to the same corresponding groups of data, address, and control signal input channels of the buffer probe assembly as every other replacement plug assembly so that the data, address, and control information is transmitted to the data acquisition system through the buffer probe assembly over the same input line groups regardless of the microprocessor under test. This enables programmable data acquisition circuits of the logic analyzer to accommodate microprocessors having differing pin arrangements without a change in data acquisition circuit hardware or wiring.

8 Claims, 6 Drawing Figures

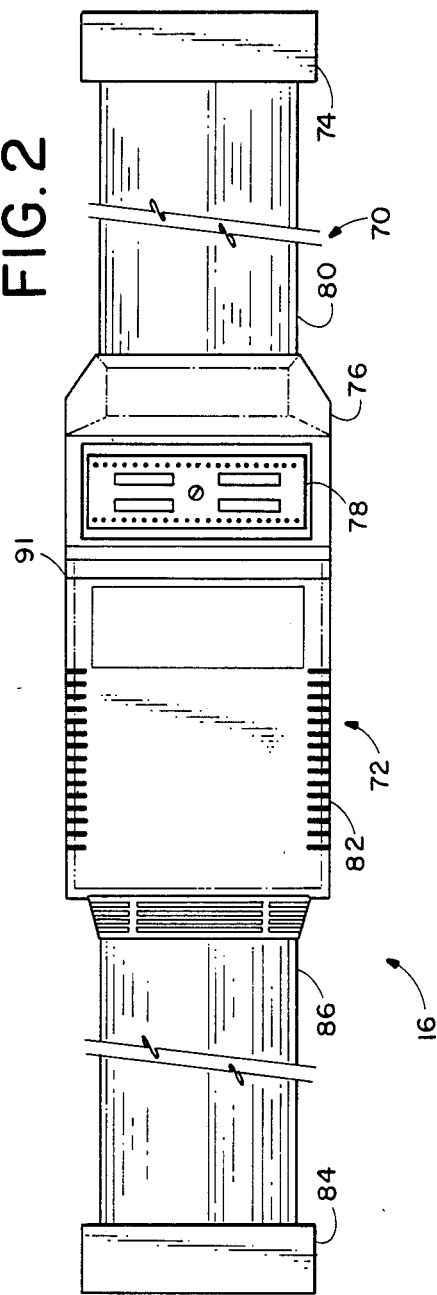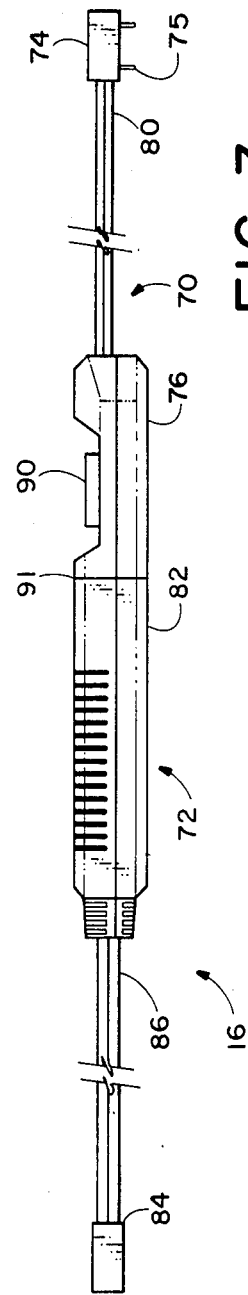

RETARGETABLE BUFFER PROBE

BACKGROUND OF THE INVENTION

The present invention relates in general to logic analyzer probes and in particular to a probe which may be retargeted to access the pins of a variety of different microprocessors.

Logic analyzers typically monitor the address and data busses and the control lines appearing on the pins of a microprocessor chip and display on a screen the sequential history of the microprocessor operation, including the states of the control lines and of the address and data busses of the processor. Logic analyzers often access the address, data and control lines of the processor by means of a probe inserted between the microprocessor and its socket in the system under test. Such a probe typically comprises a replacement plug having a set of pins matching the microprocessor pin arrangement, for inserting into a motherboard in place of the microprocessor, and a socket into which the microprocessor can be inserted. Internal probe wiring connects the pins of the microprocessor to the appropriate replacement plug pins and to buffers within the probe which can transmit the data appearing at the pins of the microprocessor to the logic analyzer data acquisition circuits.

The data acquisition circuits of a logic analyzer typically store the acquired data characterizing each microprocessor transaction in a random access acquisition memory, with data representing successive transactions being stored sequentially at successive addresses. Since the states of data and address busses of a microprocessor are only valid for a portion of a transaction cycle, a transaction analyzer is normally provided to monitor selected control lines of a microprocessor, to determine when a valid transaction has occurred and to generate a write strobe signal to the acquisition memory. The acquisition memory then stores the acquired data.

In the prior art, much of the data acquisition portion of a logic analyzer, including the probe, was specifically designed for use with only one type of microprocessor because different microprocessors have different pin arrangements, different types of control lines, different types of transactions and different timing requirements. Therefore a separate probe, transaction analyzer, and related data acquisition circuit components must be designed and constructed to be specifically targeted for each type of microprocessor to be tested. This places a heavy cost burden on users performing logic analysis on a variety of different microprocessors. What is needed and would be useful would be a probe which could be used in conjunction with a logic analyzer having a programmable transaction analyzer, and which could be retargeted to acquire data from a number of different types of microprocessors with a minimum change in probe hardware and with no change in logic analyzer data acquisition hardware.

SUMMARY OF THE INVENTION

According to one aspect of the invention, a logic analyzer probe comprises a replacement plug assembly and a buffer probe assembly. The replacement plug assembly incorporates those portions of probe equipment which must be specifically configured to access the pins of a selected microprocessor. The buffer probe assembly comprises those portions of probe equipment which are adapted for use with a wide variety of microprocessors. The replacement plug assembly and the probe assembly are mechanically joined and electrically coupled by a connector permitting the replacement plug assembly to be removed from the probe and replaced with a different replacement plug assembly configured to access the pins of a different microprocessor. Thus, by changing only the replacement plug assembly, the probe may be retargeted to accommodate a variety of different microprocessors so that a user need only purchase a replacement plug assembly for each type of microprocessor to be analyzed rather than an entire probe. Since the replacement plug assembly of the present invention is much less expensive than an entire probe of the prior art, the attendant savings is substantial both for the manufacturer in not having to develop, and for the user in not having to purchase a new probe for each new microprocessor that becomes available.

The buffer probe assembly includes electrostatic discharge protecting circuits, along with buffers, cables and connectors for transmitting information to the logic analyzer. The replacement plug assembly includes a replacement plug, having a pin arrangement matching the pin arrangement of a selected microprocessor so that the replacement plug may be inserted into a motherboard socket in place of the microprocessor. The replacement plug assembly also includes a socket adapted for mounting the microprocessor, and a cable for interconnecting the socket and replacement plug. The data, address, control and other lines at the pins of the microprocessor mounted in the plug assembly socket are connected through the pins of the replacement plug to the appropriate points on the motherboard socket of the system under test. The replacement plug assembly further includes a cross-connect circuit and a portion of the connector for coupling the microprocessor lines to the buffer probe assembly.

According to a another aspect of the invention, the cross-connect circuit associated with each replacement plug assembly connects the data, address and control lines of the associated microprocessor to the same corresponding groups of buffer probe connector pins as does every other replacement plug assembly. In this way the data, address and control information transmitted to the logic analyzer through the buffer probe assembly arrives at the logic analyzer on the same groups of input lines, regardless of the microprocessor under test. If the logic analyzer includes data acquisition equipment such as a transaction analyzer which can be programmed to accommodate different microprocessors, then no change in logic analyzer wiring is necessary to insure that the appropriate control signals from the microprocessor being probed are applied to the transaction analyzer. The attendant savings and convenience to the user in not having to change logic analyzer hardware for each new microprocessor on the market can also be substantial.

It is accordingly an object of the invention to provide a new and improved logic analyzer probe having an easily replaceable and relatively inexpensive section allowing the probe to be retargeted to access the pins of a wide variety of different microprocessors without completely changing probe hardware.

It is another object of the invention to provide a new and improved logic analyzer probe adapted to access the pins of differing microprocessors and to transmit control, data, and address signals from each microprocessor to a logic analyzer in a consistent order over a parallel interconnecting cable regardless of the type of microprocessor being probed, to obviate the need for differences in logic analyzer hardware for accessing different microprocessors.

The subject matter of the present invention is particularly pointed out and distinctly claimed in the concluding portion of this specification. However, both the organization and method of operation, together with further advantages and objects thereof, may best be understood by reference to the following description taken in connection with the accompanying drawings wherein like reference characters refer to like elements.

DRAWINGS

FIG. 1 is a block diagram of a data acquisition system for a logic analyzer system including a retargetable probe according to the present invention;

FIG. 2 plan view of a retargetable probe according to the present invention;

FIG. 3 is a side view of the retargetable probe of FIG. 2;

DETAILED DESCRIPTION

Figure 1:
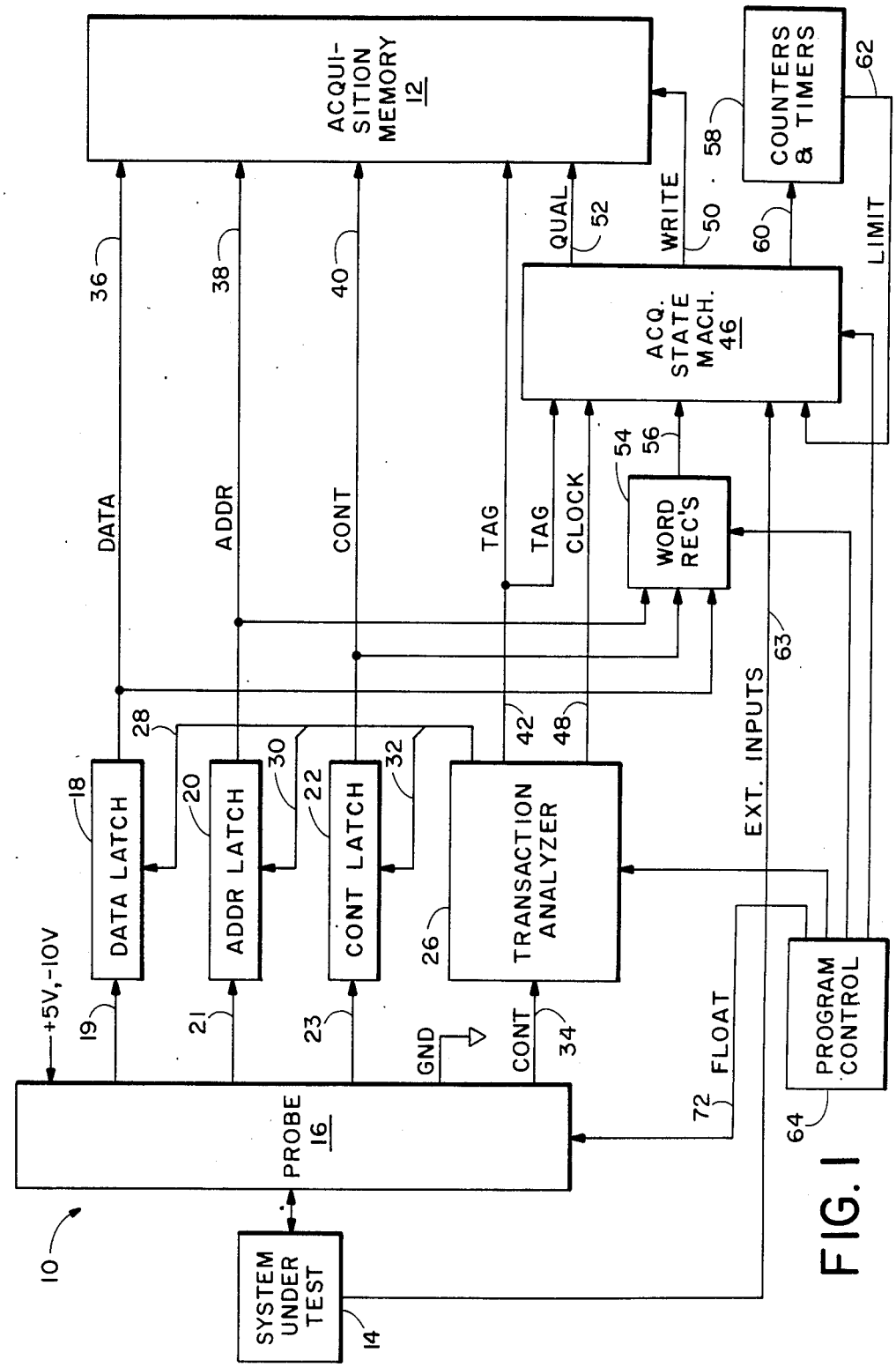

Referring to FIG. 1, a data acquisition system 10, illustrated in block diagram form, is adapted to acquire and store in a random access acquisition memory 12, a sequence of data, address and selected control line states of a microprocessor operating in conjunction with system under test 14. System 10 comprises probe 16, according to the present invention, which connects the data, address and a selected portion of control lines appearing on the pins of the microprocessor under test to data, address and control latches 18, 20 and 22, through internal buffers and cross-connect wiring in the probe and lines 19, 21 and 23 respectively. Probe 16 also connects other selected control lines appearing at the pins of the microprocessor to the input of transaction analyzer 26 over lines 34.

Transaction analyzer 26 controls the storage of the data, address, and control information from probe 16 in latches 18, 20 and 22 by generating appropriate latching control signals on control output lines 28, 30 and 32 to the latches at the appropriate times according to the state of the selected control line data on lines 34. Data stored in latches 18, 20 and 22 is carried on data, address and control line busses 36, 38, and 40 from the latches to the data input terminals of acquisition memory 12. When transaction analyzer 26 determines from the state of the selected control line data on lines 34 the type of transaction, such as a read or a write operation, being performed by the microprocessor of system 14, it generates on bus 42 a binary coded TAG signal representing the type of transaction. Bus 42 leads to other data input terminals of acquisition memory 12 and to the input of an acquisition state machine 46. The transaction analyzer 26 also generates a CLOCK signal which causes latches 18, 20 and 22 to store new data from probe 16.

The CLOCK signal is additionally transmitted to inputs of acquisition state machine 46 over line 48.

Acquisition state machine 46 controls the data storage operation of acquisition memory 12 by transmitting a WRITE signal on line 50 to the write control input of memory 12, causing memory 12 to increment its current address by 1 and to store the data on lines 36, 38, 40 and 42 at the current address. When the current memory address is incremented past its largest possible number, the address is reset to the lowest number and the current data is written into memory over prior stored data at that address.

Acquisition state machine 46 also generates and transmits over line 52 to memory 12 a QUALify bit. Acquisition state machine 46 may be programmed so that it may not generate a WRITE signal every time it receives a CLOCK signal from transaction analyzer 26 such that the sequence of data stored in memory 12 may contain gaps wherein data representing one or more successive microprocessor transactions was not stored in memory 12. The QUAL bit is set and stored with the current data on lines 36, 38, 40 and 42 whenever such a gap in data storage has occurred immediately prior to storage of the current data.

State machine 46 and transaction analyzer 26 may be programmed prior to initiation of data acquisition through program control device 64 which may comprise a microprocessor system having control, address and data lines coupled to each of the controlled devices. In addition, program control device 64 controls the enabling of tristate signal buffers in probe 16 by asserting a FLOAT line to disenable the buffers.

Transaction analyzer 26 comprises a programmable logic device capable of performing the functions described hereinabove. Such a transaction analyzer is disclosed in U.S. patent application No. 730,418, filed May 6, 1985, entitled "Transaction Analyzer".

In order for data acquisition system 10 to function properly, the data signals from the microprocessor of the system under test must appear on lines 19 from the probe 16 regardless of the type of microprocessor under test. Similarly the address signals must appear on lines 21 and the control signals must be appropriately divided between lines 23 and 34. Therefore probe 16 of the present invention, depicted in plan view in FIG. 2 and in elevation view in FIG. 3, is "retargetable" for different microprocessors so that it may access the pins of a variety of different types of microprocessors and transmit the data thereon to the latches and transaction analyzer of the data acquisition system 10 over the proper signal line groups.

The probe 16 comprises a replacement plug assembly 70 and a buffer probe assembly 72. The replacement plug assembly 70 comprises those portions of probe 16 equipment which must be specifically adapted to accommodate a selected microprocessor, while the buffer probe assembly 72 comprises those portions of the probe 16 which are adapted for use with a wide variety of microprocessors. The replacement plug assembly and the buffer probe assembly are joined and electrically coupled by a connector at joint 91 which permits the replacement plug assembly 70 to be removed from the buffer probe assembly 72 and replaced with a different, appropriate reconfigured replacement plug assembly when a system having a different microprocessor is to be tested. Thus only a portion of the probe 16 is changed to accommodate different microprocessors.

The probe is partitioned so that the complex, expensive elements of the probe, which need not be separately configured to suit different microprocessors, are located in the buffer probe assembly 72, while the less expensive elements of the probe, which must be configured differently for each type of microprocessor, are located in the replacement plug assembly. The probe may therefore be easily retargeted for any microprocessor simply by replacing the relatively inexpensive replacement plug assembly.

The replacement plug assembly 70 includes a replacement plug 74 with pins 75 sized and arranged to match the pin arrangement of a particular microprocessor to be tested, a housing 76, and a zero insertion force (ZIF) socket 78 suitable for mounting the microprocessor from the system under test. To access the pins of the microprocessor, the microprocessor 90 is removed from its socket on the system under test and inserted into the ZIF socket 78 of the probe 16. The replacement plug 74 is then inserted into the microprocessor socket on the system under test. A microprocessor 90 is shown inserted in the ZIF socket in FIG. 3, whereas the ZIF socket 78 is shown without the microprocessor in FIG. 2. Two ribbon cables 80 interconnect the pins of the microprocessor 90 to corresponding pins 75 of the replacement plug 74 such that the microprocessor is able to interact with the system under test in a normal fashion.

The buffer probe assembly 72 of probe 16 includes a probe assembly housing 82, a set of two or more plugs 84 adapted to mate with the input terminals of a data acquisition system, and two or more ribbon cables 86 to connect the plugs 84 to circuits within buffer probe assembly housing 82. Replacement plug assembly 70 is joined to buffer probe assembly 72 at joint 91 by means of an internal square pin connector, not visible in FIGS. 2 and 3. The replacement plug assembly 70 includes cross-connect circuits within housing 76 which couple the data, address, and control lines of microprocessor 90 to selected pins of the square pin connector. The square pin connector carries the data on these lines to protection and buffering circuits within housing 82 of the buffer probe assembly 72. The protection and buffering circuits further transmit the data to the data acquisition system of a logic analyzer over transmission line cables 86 and through plugs 84. Cables 86 include lines 19, 21, 23 and 34 of FIG. 1.

Cross-connect wiring within each differently configured replacement plug assembly 70 connects the data, address and control lines of the associated microprocessor 90 to the pins of the square pin connector in the same general order as in every other replacement plug assembly so that the data, address and control information are transmitted to the data acquisition circuit through the buffer probe assembly 72 appropriately divided among lines 19, 21, 23 and 34 of cables 86, regardless of the particular microprocessor under test. Thus if the transaction analyzer 26 and word recognizer 54 of the data acquisition system 10 can be programmed to accommodate different microprocessors, only the replacement plug assembly 70 of the probe 16 need be changed to accommodate a change in microprocessor under test.

Figure 4:
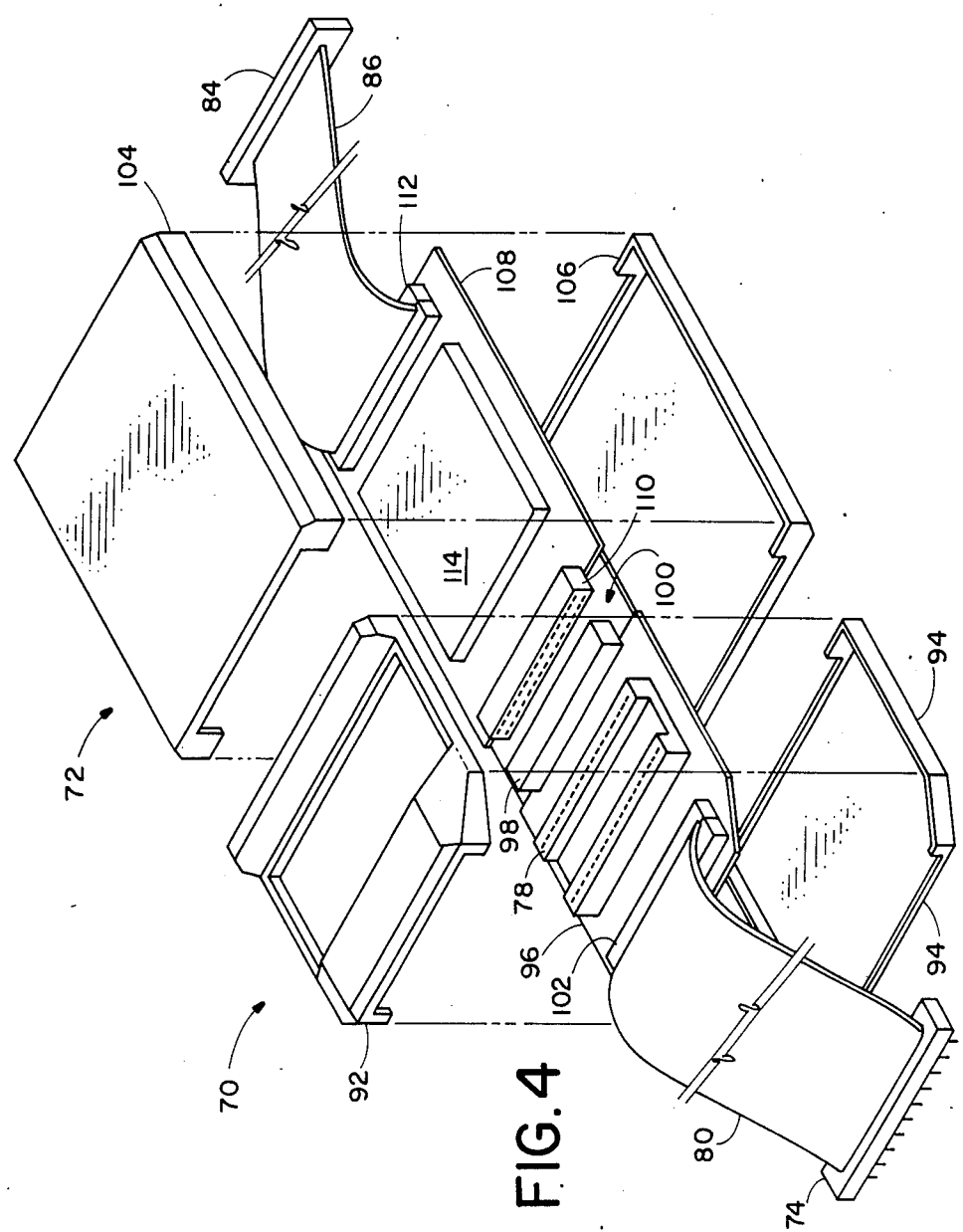
FIG. 4 is a simplified, exploded perspective view of the retargetable probe of FIG. 2.

FIG. 4 is an exploded perspective view of the replacement plug assembly 70 and the buffer probe assembly 72 of the probe 16 of FIGS. 2 and 3. The replacement plug assembly 70 includes an upper housing 92, a lower housing 94, and a circuit board 96. The female portion 98 of the square pin connector 100 and the ZIF connector 78 are mounted on circuit board 96 along with a pair of connectors 102 for attaching ribbon cables 80 from the replacement plug 74. The buffer probe assembly 72 of probe 16 includes an upper housing 104, a lower housing 106 and a circuit board 108. The male portion 110 of square pin connector 100, along with connectors 112 for attaching transmission line cables 86, and various protection and buffering circuits 114, are all mounted on circuit board 108 within the buffer probe assembly 72.

Figure 5:
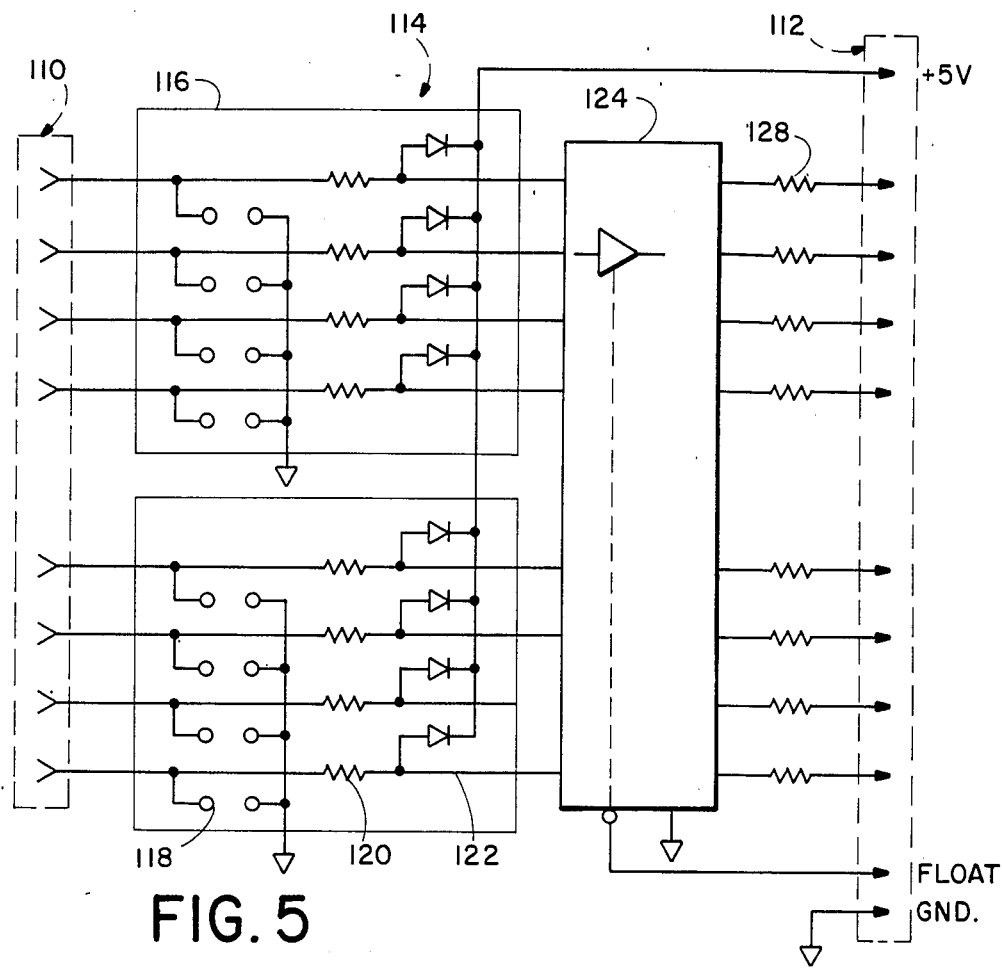
FIG. 5 is a schematic diagram of an preferred embodiment of eight channels of a buffer probe assembly of a retargetable probe according to the present invention.

FIG. 5 is a circuit diagram of typical protection and buffering circuits 114 of the buffer probe 72 assembly providing buffering and protection for eight data channels. Each signal from square pin connector 110 is applied to an input of a static protection circuit 116 comprising a laser trimmed spark gap 118, for discharging high voltage spikes to ground, and a current limiting series resistor 120. A diode 122 has its anode connected to the signal line and its cathode coupled to a +5V source from the data acquisition system 10 to limit the maximum signal line voltage to approximately 5.5V. After passing through protection circuit 116, the signal is applied to a tri-state buffer 124 which may be disabled by the FLOAT signal from the data acquisition system 10 applied to the enabling terminal of buffer 124. The output of buffer 124 is applied to the terminals of connector 112 through a resistor 128, which serves to back terminate the transmission line cables 86.

Figure 6:
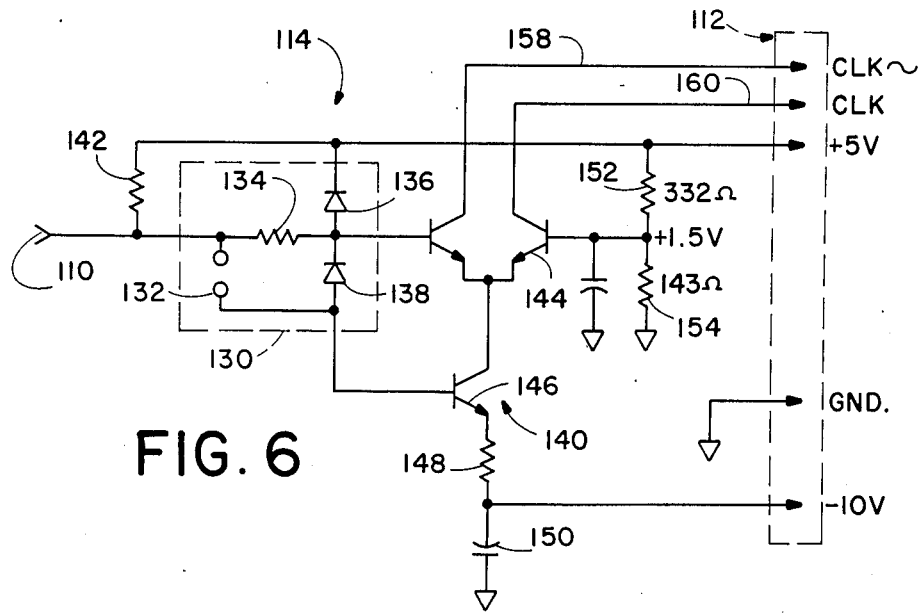
FIG. 6 is a schematic diagram of a preferred embodiment of one high speed channel of a buffer probe assembly of a retargetable probe according to the present invention.

FIG. 6 is a circuit diagram of a preferred embodiment of protection and buffering circuits 114 of the buffer probe assembly 72 providing buffering and protection for one high speed channel. The embodiment of FIG. 6 is preferable when inverted and non-inverted inputs to the data acquisition system 10 are required as is typically the case when a clock signal is accessed. In addition, the differential outputs provide excellent noise immunity, resulting in less crosstalk and signal skew, especially important when buffering clock signals.

A signal from the microprocessor, arriving at a pin of connector 110, is applied to an input of a differential comparator 140 through a static protection circuit 130 including a shunting spark gap 132 and a series resistor 134. A resistor 142 is connected between the signal input and a +5V source from the data acquisition system to pull up the signal input when it is not pulled down at its source in the system under test. The voltage swing of the input is limited by a diode 136 with anode connected to the differential comparator 140 input and cathode connected to the +5V source and by a diode 138 with cathode connected to the differential comparator 140 input and anode connected to ground. Differential comparator 140 includes emitter-coupled bipolar transistor pair 144 and a bipolar transistor 146 having its collector connected to the emitters of pair 144, base grounded, and emitter coupled to a −10V source from the data acquisition system through a resistor 148. Transistor 146 and resistor 148 comprise a constant current source for the differential comparator 140. A capacitor 150 shunts AC noise on the −10V source to ground.

A 1.5V reference voltage is generated by a voltage divider comprising a 332 ohm resistor 152 in series with a 143 ohm resistor 154 between the +5V source and ground. The 1.5V reference voltage is applied to an inverting input of comparator 140 at the base of one of the emitter-coupled transistor pair 144. A capacitor 156 shunts AC noise on the 1.5V supply to ground. The collectors 158 and 160 of the emitter-coupled pair 144 are connected to separate pins of connector 112. The input signal from the microprocessor is applied through the static protection circuits 130 to the non-inverting amplifier input at the base of the other transistor of the emitter-coupled pair 144. When the signal at the non-inverting amplifier input exceeds the 1.5V reference, collector 160 goes high and collector 158 goes low. If the signal from the microprocessor is lower than 1.5V, collector 158 is high and collector 160 is low. Thus the protection and buffering circuit 114 transmits inverted and non-inverted signals to the data acquisition system in response to a single input signal.

It is seen that the replacement plug assembly 70 comprises those portions of probe equipment which must be specifically adapted to accommodate a selected microprocessor, while the buffer probe assembly 72 comprises portions of probe 16 equipment which are adapted for use with a wide variety of microprocessors. Since replacement plug assembly 70 and the probe assembly 72 are joined and electrically coupled by the square pin connector 100, the replacement plug assembly 70 may be removed from the probe 16 and replaced with a different replacement plug assembly 70 having a different ZIF socket 78, a different replacement plug 74, and different cross-connect wiring when a different microprocessor is to be probed. Thus only a portion of the probe 16 need be changed to accommodate different microprocessors. Further, each replacement plug assembly 70 cross-connects the data, address and control lines of the associated microprocessor to the pins of the buffer probe connectors 84 in the same order as in every other replacement plug assembly so that the data, address and control information is transmitted to the data acquisition system through the buffer probe assembly in a consistent manner, regardless of the microprocessor under test. This enables programmable data acquisition circuits to accommodate microprocessors having differing pin arrangements without a change in data acquisition system 10 hardware.

While a preferred embodiment of the present invention has been shown and described, it will be apparent to those skilled in the art that many changes and modifications may be made without departing from the invention in its broader aspects. For instance, the probe of the present invention may be adapted to access the pins of integrated circuits other than microprocessors, and the probe may be used in conjunction with test equipment other than logic analyzers. The appended claims are therefore intended to cover all such changes and modifications as fall within the true spirit and scope of the invention.

We claim:

1. A probe for accessing signals appearing on a set of external connection pins of an operating integrated circuit and for buffering said signals for external transmission, said probe comprising:

a replacement plug assembly, configured for accessing said pins by having a plug adapted for insertion into a mounting socket in which said integrated circuit normally is inserted when operating, and having a test socket adapted for holding said integrated circuit by said pin set, said test socket and said plug being interconnected such that when said integrated circuit is held by said test socket, and said plug is inserted into said mounting socket, said integrated circuit operates as if it were inserted in said mounting socket;

a buffer probe assembly having signal buffering means, said replacement plug assembly and said buffer probe assembly being mounted in physically separable enclosures; and means for selectively connecting the replacement plug assembly to the buffer probe assembly so that signals appearing on said integrated circuit pins are reordered by the replacement plug assembly and buffered by said buffering means for external transmission in a format independent of the type of integrated circuit.

2. A probe as in claim 1 wherein said integrated circuit comprises a microprocessor.

3. A probe as in claim 1 wherein said buffer probe assembly comprises means for protecting said buffering means from extreme variations in voltage of said signals.

4. A probe as in claim 1 wherein said means for connecting comprises a portion having a plurality of connecting pins and a portion having a plurality of associated sockets for receiving said connecting pins, one of said portions being rigidly mounted in said buffer probe assembly housing and another of said portions being rigidly mounted in said replacement plug assembly housing, said connecting pins being adapted to carry said signals from said replacement plug assembly to said buffer probe assembly and to maintain said buffer probe and said replacement plug assembly housings in rigid juxtaposition when said pins are inserted in said associated sockets.

5. A retargetable probe for accessing signals appearing on external connection pins associated with any one of a plurality of different operating integrated circuits and for buffering said signals for external transmission, said probe comprising:

a plurality of replacement plug assemblies, each configured for accessing said pins associated with a separate one of said integrated circuits, each of said replacement plug assemblies having a plug adapted for insertion into a mounting socket in which said integrated circuit normally is mounted when operating, and having a test socket adapted for holding said integrated circuit by said pin set, said test socket and said plug being interconnected such that when said integrated circuit is held by said test socket, and said plug is inserted into said mounting socket, said integrated circuit operates as if it were inserted in said mounting socket;

a buffer probe assembly having signal buffering means, each one of said replacement plug assemblies and said buffer probe assembly being mounted in physically separable enclosures; and means for connecting any selected one of said replacement plug assemblies to the buffer probe assembly so that signals appearing on said pins of the integrated circuit accessed by said selected replacement plug assembly are reordered by the selected replacement plug assembly and buffered by said buffering means for external transmission in a format independent of the type of integrated circuit.

6. A probe as in claim 1 wherein said means for connecting comprises a portion having a plurality of connecting pins and a portion having a plurality of associated sockets for receiving said connecting pins, one of said portions being rigidly mounted in said buffer probe assembly housing and another of said portions being rigidly mounted in said selected replacement plug assembly housing, said connecting pins being adapted to carry said signals from said selected replacement plug assembly to said buffer probe assembly through said connecting pins and to maintain said buffer probe and said selected replacement plug assembly housing in rigid juxtaposition when said pins are inserted in said associated sockets.

7. A probe as in claim 5 wherein said integrated circuits comprise microprocessors and said signals comprise control, address and data signals.

8. A probe as in claim 7 wherein each said replacement plug assembly further comprises means for applying said control, data and address signals to corresponding groups of said connecting pins, said corresponding pin groups being identically juxtaposed in each said replacement plug assembly.

* * * * *